US012762318B1

(12) United States Patent
Chase et al.

(10) Patent No.: US 12,762,318 B1
(45) Date of Patent: Oct. 13, 2026

(54) BLOCK VIRTUALIZATION FOR MULTI-THREADED ELECTRONIC DESIGN AUTOMATION READ/WRITE DATABASE ACCESS

(71) Applicant: Synopsys, Inc., Mountain View, CA (US)

(72) Inventors: John R. Chase, Brentwood, CA (US); Paul M. Furnanz, Lake Oswego, OR (US); Darren C. Cronquist, San Francisco, CA (US)

(73) Assignee: Synopsys, Inc., Sunnyvale, CA (US)

(*) Notice: Subject to any disclaimer, the term of this patent is extended or adjusted under 35 U.S.C. 154(b) by 738 days.

(21) Appl. No.: 18/204,323

(22) Filed: May 31, 2023

(51) Int. Cl.
*G06F 30/337* (2020.01)
*G06F 3/06* (2006.01)

(52) U.S. Cl.
CPC .......... *G06F 30/337* (2020.01); *G06F 3/0604* (2013.01); *G06F 3/064* (2013.01); *G06F 3/0665* (2013.01); *G06F 3/0673* (2013.01)

(58) Field of Classification Search
CPC ........ G06F 3/067; G06F 3/0604; G06F 3/061; G06F 3/0619; G06F 3/065; G06F 3/0659; G06F 3/0679; G06F 3/0653; G06F 3/0673; G06F 3/0688; G06F 3/0608; G06F 3/0644; G06F 3/064; G06F 3/0647; G06F 3/0616; G06F 3/165; G06F 3/0685; G06F 3/167; G06F 3/0629; G06F 3/0655; G06F 3/0632; G06F 3/0665; G06F 3/0635; G06F 3/0649; G06F 30/39; G06F 3/048; G06F 3/0607; G06F 3/0623; G06F 3/0638; G06F 3/0652; G06F 30/331; G06F 30/34; G06F 30/347; G06F 3/0605; G06F 3/0617; G06F 3/0622; G06F 3/0625; G06F 3/0631; G06F 3/0634; G06F 3/0637; G06F 3/0656; G06F 3/0661; G06F 3/0689; G06F 3/0664; G06F 3/0613; G06F 30/17; G06F 30/392; G06F 3/0614; G06F 3/0658; G06F 30/30; G06F 30/323; G06F 30/398; G06F 30/394; G06F 3/068; G06F 3/0628; G06F 3/0646; G06F 3/0601; G06F 3/0611; G06F 3/0626
USPC .................................. 716/110–116, 110–117
See application file for complete search history.

(56) References Cited

U.S. PATENT DOCUMENTS

| | | | | |
|---|---|---|---|---|
| 10,929,303 | B2* | 2/2021 | Chung | G06F 12/0246 |
| 2014/0376320 | A1* | 12/2014 | Loh | G11C 29/76 365/200 |
| 2018/0052599 | A1* | 2/2018 | Arimilli | G06F 12/0897 |
| 2018/0114290 | A1 | 4/2018 | Paltashev et al. | |
| 2022/0269417 | A1 | 8/2022 | Sanvido et al. | |
| 2022/0405200 | A1 | 12/2022 | Karr | |

* cited by examiner

*Primary Examiner* — Binh C Tat
(74) *Attorney, Agent, or Firm* — Lowenstein Sandler LLP

(57) ABSTRACT

A method includes accessing, by a processing device, an electronic design of an integrated circuit. The method further includes generating a virtual block corresponding to an actual block of the electronic design, the virtual block including a plurality of virtual subblocks corresponding to a plurality of actual subblocks in the actual block. The method also includes cloning or shallow copying contents of the plurality of actual subblocks in the corresponding virtual subblocks, wherein the cloned contents in the virtual subblocks are linked to the corresponding actual subblocks and no data is copied.

18 Claims, 5 Drawing Sheets

BLOCK VIRTUALIZATION FOR MULTI-THREADED ELECTRONIC DESIGN AUTOMATION READ/WRITE DATABASE ACCESS

TECHNICAL FIELD

The present disclosure relates generally to electronic design automation (EDA). In particular, the present disclosure relates to block virtualization for multi-threaded EDA read/write database access.

BACKGROUND

Multi-threaded database access is used to improve the performance of database applications by allowing multiple threads of execution to access a database simultaneously. In a traditional single-threaded database access model, only one thread of execution can access the database at a time, which can result in long wait times for other threads attempting to access the same database. However, with multi-threaded database access, multiple threads can access the database at the same time, allowing for greater concurrency and faster response times. This method can be especially useful for applications that require frequent database accesses, such as electronic design automation (EDA). However, multi-threaded database access requires careful management of concurrency and locking mechanisms to ensure that multiple threads don't try to access or modify the same data at the same time, which can result in data corruption and other errors. Proper synchronization and transaction management methods can be used to ensure data consistency and integrity.

BRIEF DESCRIPTION OF THE DRAWINGS

The disclosure may be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
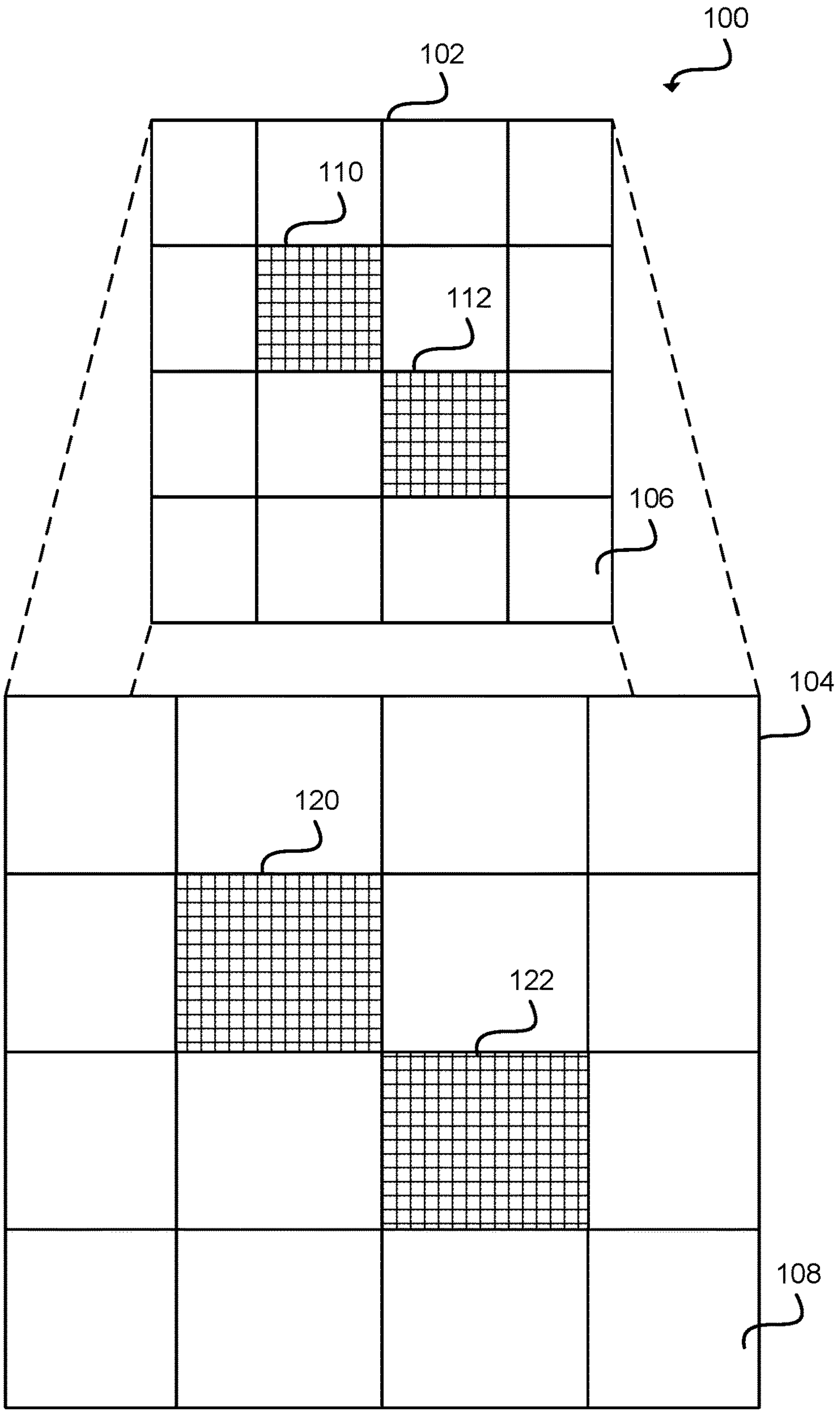
FIG. 1 illustrates a method for block virtualization for multi-threaded EDA read/write database access, in accordance with an embodiment of the present disclosure.

Current database models of circuitry in electronic design automation (EDA) have many interdependencies between database objects representing cells, nets, ports, pins, shapes, etc., such that modifying the data on one object results in data modification of other objects. These interdependencies make general multithreaded read/write access challenging. In a new data model (NDM), this issue can be handled for a given block by guaranteeing software consistency using the multiple reader or one write ("MROW") contract that allows a client to either do multi-threaded reads of a block, or do single-threaded write to a block, but not both.

However, given the size and complexity of blocks in an electronic design, the MROW requirement is too limiting and prevents full utilization of available processor cores. Some existing solutions make full copies of the electronic design and operate on each independently. The problem with the full copy approach is that the memory required to store the copies would exceed the available random access memory (RAM) in each machine, as the size of the main block would typically be very large and consume a significant portion of machine RAM, thereby requiring a lot of memory and runtime overhead. Another approach would be to make copies of subsets of the main design's contents so that each copy has a significantly smaller memory footprint than the main design. The drawback with that method is that the client has a limited view of the block contents from the perspective of a given copy, making global block analysis impossible without referencing the original block, which would be out-of-date with respect to changes made in the copy.

Embodiments disclosed herein provide a lower memory overhead of the subset copy approach, but the visibility benefits of the full copy approach by copying a subset of the main block, and "virtualizing" the remaining uncopied contents. The result is that the copy looks to the client like the full main block in that it has all the contents, but only a subset of the contents is actually copied and writable. This allows the client to operate on many "copies" of the main block simultaneously, which is not possible to do directly on the main block due to the MROW contract. The copy blocks appear to the client to be complete copies of the main block, with the caveat that only the explicitly copied contents are "writable," meaning they may be modified, whereas the virtual contents are "read-only" and may not be modified, as they actually reside in the main block, and modifying them would violate MROW.

The virtualization works by having the contents of the main block report themselves as members of the copy block from which the query is made. That is, the client queries the copy block for its contents, and if the contents being queried are not copied to the copy block, the database retrieves the corresponding contents from the main block and returns those. If those returned contents are queried for their owner block, either by the client or internally by the database, they will return the copy block, even though they reside in the main block. This is accomplished by associating the thread context of the request with the copy block.

Accordingly, some embodiments relate to methods used in electronic design automation (EDA) to improve efficiency and scalability of accessing and modifying large databases of electronic design data. The method involves partitioning the database into smaller, more manageable blocks, each of which can be accessed and modified by multiple threads of execution simultaneously. Each block is assigned a unique identifier and a set of read/write permissions that control access to the block by different threads. When a thread needs to access a particular block, it first checks the block's permissions to determine whether it has the necessary rights to read from or write to the block. If it does, it can proceed with the access operation. If it does not, it must wait until the permissions are granted by the thread that currently has control of the block.

To further improve performance and reduce contention for database resources, the method also involves virtualizing the blocks, which means that each block appears as a separate, independent copy of the data, even though the data may be shared between multiple blocks. This allows different threads to modify different parts of the database simultaneously without interfering with each other.

The method can be particularly effective in multi-core or distributed computing environments where multiple threads are executing concurrently and competing for access to shared database resources. By partitioning the database into smaller, more manageable blocks and virtualizing those blocks, the technique can significantly improve performance and scalability of the EDA software.

Embodiments disclosed herein are particularly useful in collaborative editing of an electronic design, where multiple users may be making changes to the electronic design at the same time. By efficiently managing undo/redo data in a virtual block-based system, the method allows users to easily undo or redo changes made to the electronic design, even when multiple users are making changes simultaneously. Embodiments disclosed herein provide an efficient and effective way to manage changes in an object-based system, particularly during redo operations. By gathering and sending the appropriate notifications and applying the necessary changes, the method ensures that the system is updated correctly and that interested parties are kept informed of any changes that have been made.

FIG. 1 illustrates a method for block virtualization for multi-threaded EDA read/write database access, according to some embodiments. A new data model (NDM) as used herein refers to a library format that stores circuit files from synthesis through place and route, and to signoff. The NDM database includes libraries that include information about the electronic design of the IC. For example, libraries include information about design cells, standard cells, macro cells, and so on. They may also include physical description and logical information of the cells. NDM may include reference libraries and design libraries. A reference library includes standard cells and hard or soft macro cells. A reference library may also include physical information such as routing directions and the placement unit tile dimensions which is the width and height of the smallest instance that can be placed. A design library may include a design cell which includes reference to multiple reference libraries, such as standard cells and macro cells.

Initially, a processing device in a networked computer may receive or access an electronic design 100 of an integrated circuit (IC). The electronic design may include modeled circuitry components, such as cells, nets, ports, pins, shapes, etc. Specifications for a circuit or electronic structure may range from low-level transistor material layouts to high-level description languages. A high-level of abstraction may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which can be used for detailed descriptions of circuits with many analog components. Descriptions at each level of abstraction are enabled for use by the corresponding tools of that layer (e.g., a formal verification tool).

Upon accessing the electronic design 100, the processing device may generate a virtual block 104 corresponding to an actual block 102 of the electronic design 100. The virtual block may include a plurality of virtual subblocks 108 corresponding to a plurality of actual subblocks 106 in the actual block 102. The processing device may clone (or make shallow copies of) contents of the actual subblocks 106 in the corresponding virtual subblocks 108 and link the cloned contents (shallow copies) in the virtual subblocks 108 to the corresponding actual subblocks 106. However, no data is copied. For example, a shallow copy is a copy of an object that only copies the top-level structure of the object, without copying the contents of any nested objects. In other words, the top-level structure of an object in the actual subblock 106 may be copied to the virtual subblocks 108. However, the top-level structure may not contain any modeled circuitry components, such as cells, nets, ports, pins, etc., and if a user attempts to access the components of the virtual subblock 108, the processing device may generate an error or throw an exception. The processing device may then copy contents of one or more of the actual subblocks 110, 112 in the actual block 102 to the corresponding virtual subblocks 120, 122 in the virtual block 104, respectively. The contents are copied in such a way that a memory location of the content copied to the virtual subblocks 120, 122 of virtual block 104 differs from a memory location of the content in the actual subblocks 110, 112 of the actual block 102. The processing device may then map the memory location of the content copied to the virtual subblocks 120, 122 and the memory location of the content in the actual subblocks 110, 112 in a pointer map.

A "pointer map" as used herein refers to a data type that stores elements in key-value pairs. In a map data structure, a "memtoSet" map element refers to a key-value pair where the key is a memory address or pointer to a memory location, and the value is a set of elements that are associated with that memory location. A memtoSet map element may be used in the context of undo/redo functionality, where it is used to keep track of changes made to the data and to enable the system to revert back to previous states of the data. A memtoSet map element is used to map an object pointer in a virtual block's undo/redo data set to a corresponding main object's memory location using the virtual block's undo/redo data set pointer map. The memtoSet contains the state of the data stored at the memory location represented by the object pointer and is used to apply changes to the data when undoing or redoing actions performed on the data. An "object pointer" refers to a variable that stores the memory address of an object in memory. An object is an instance of a class, and a pointer is a variable that holds the memory address of an object. When an object is created, it is allocated a block of memory in the computer's memory, and the object pointer points to the starting address of this block of memory.

The processing device may then select at least a portion of the content copied to the virtual subblocks 120, 122 to be modified in the actual subblocks 110, 112. The processing device then makes the selected portion of the content in virtual subblocks 120, 122 to be writeable. Since the processing device is configured to operate under the MROW policy, the processing device may either perform a multi-threaded read operation of the actual block 102 or a single-threaded write to the actual block 102. The processing device may then modify a selected portion of the content in the corresponding virtual subblocks 120, 122 to form a modified selected portion. The processing device may then update the mapping in the pointer map by mapping a memory location of the modified selected portion in the virtual subblocks 120, 122 with the memory location of the content in the actual subblocks 110, 112, respectively.

The processing device may also append a change notification to the modified selected portion such that the change notification reflects a changed status of the modified selected portion. In some embodiments, the processing device may receive a notification that at least a portion of the content in the virtual subblocks has been modified by another worker. A worker refers to a thread of execution that is responsible for processing database requests and performing database operations. Each worker typically has its own database connection, and multiple workers can be created to handle multiple database requests simultaneously. This allows for greater concurrency and improved performance, as multiple threads can process database requests in parallel.

In such an instance, the processing device may update the mapping in the pointer map by mapping a memory location of the modified portion in the virtual subblocks and the memory location of the corresponding content in the actual subblocks in the pointer map. When the processing device determines that the memory location of the modified selected portion in the virtual subblocks and the memory location of the original content in the actual subblocks are already stored in the pointer map, and the processing device may merge the memory location of the modified portion in the virtual subblocks and the memory location of the modified selected portion in the virtual subblocks. When a client queries the processing device for a memory location of one or more elements in the virtual subblocks 120, 122, the processing device may return the memory location of the one or more elements in the actual subblocks 110, 112 corresponding to the virtual subblocks, in response.

In some embodiments, the processing device may provide a client with access to the virtual subblocks and enable multithreaded operations on the virtual subblocks by different threads of execution. Each thread may have access to a corresponding actual subblock 106. The processing device may then update the contents of the virtual subblocks to reflect changes made to the actual subblocks by other threads and aggregate the modified actual subblocks to create a modified actual block.

Figure 2:
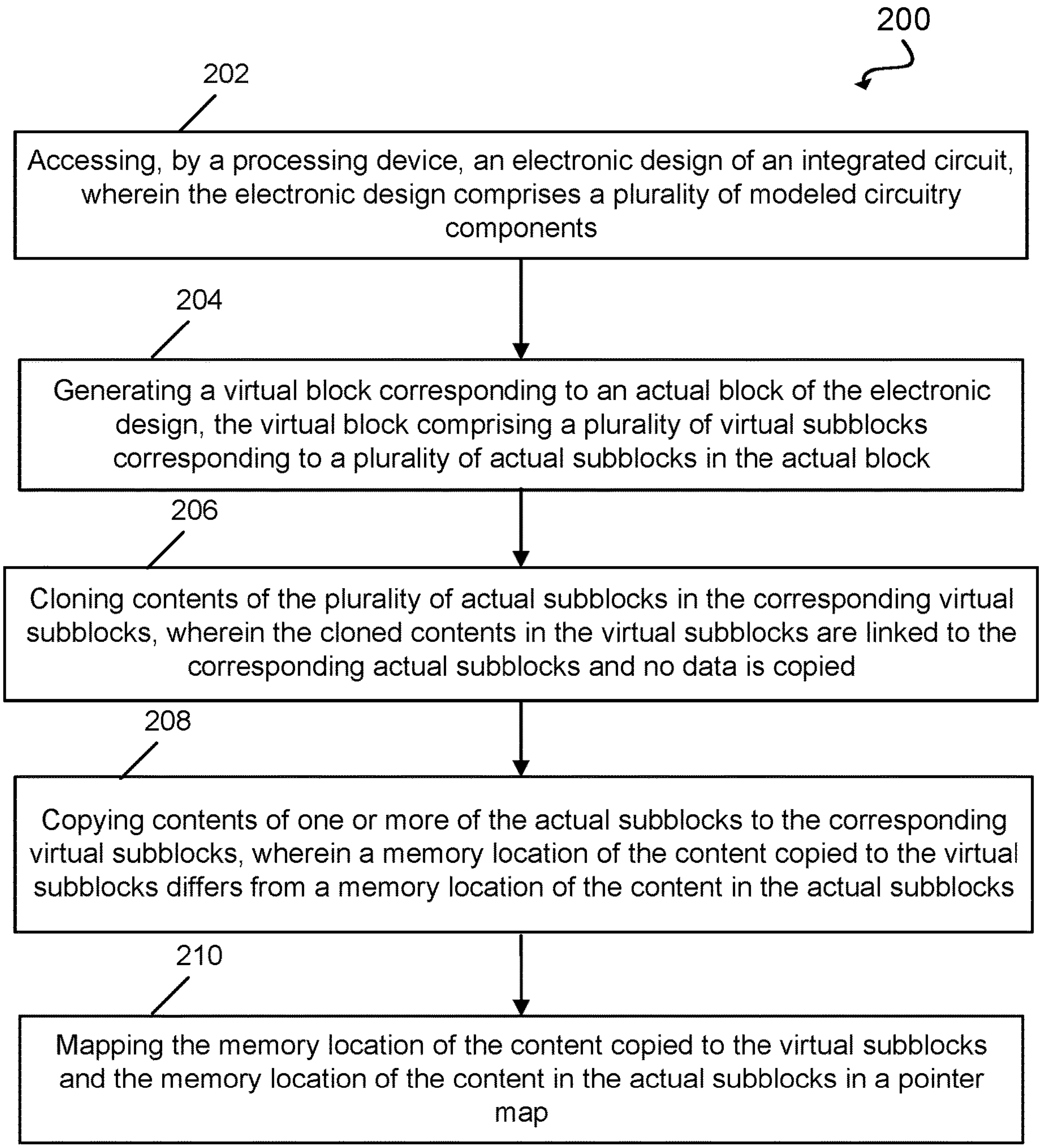
FIG. 2 illustrates example operations in a computer-implemented method for block virtualization for multi-threaded EDA read/write database access, in accordance with an embodiment of the present disclosure.

FIG. 2 depicts a flow diagram of example method 200 for block virtualization for multi-threaded EDA read/write database access, according to some implementations. Method 200 may be performed by one or more processing devices (e.g., processing device 502 illustrated in FIG. 5) that may comprise hardware (e.g., circuitry, dedicated logic), software (such as is run on a general-purpose computer system or a dedicated machine), or a combination of both. Method 200 and each of its individual functions, routines, subroutines, or operations may be performed by one or more processors of the processing device executing the method. In certain implementations, method 200 may be performed by a single processing device. Alternatively, method 200 may be performed by two or more processing devices, each processing device executing one or more individual functions, routines, subroutines, or operations of the method.

At operation 202, the processing logic of the processing device may receive or access an electronic design of an integrated circuit (IC). At operation 204, the processing logic may generate a virtual block corresponding to an actual block of the electronic design. The virtual block may include a plurality of virtual subblocks corresponding to a plurality of actual subblocks in the actual block. At operation 206, the processing logic may clone contents of the actual subblocks in the corresponding virtual subblocks and link the cloned contents in the virtual subblocks to the corresponding actual subblocks. However, no data is copied. At operation 208, the processing logic may then copy contents of one or more of the actual subblocks in the actual block to the corresponding virtual subblocks in the virtual block, respectively. The contents are copied in such a way that a memory location of the content copied to the virtual subblocks of virtual block differs from a memory location of the content in the actual subblocks of the actual block. At operation 210, the processing logic may then map the memory location of the content copied to the virtual subblocks and the memory location of the content in the actual subblocks in a pointer map.

The processing logic may then select at least a portion of the content copied to the virtual subblocks to be modified in the actual subblocks. The processing logic then makes the selected portion of the content in virtual subblocks to be writeable. Since the processing logic is configured to operate under the MROW policy, the processing logic may either perform a multi-threaded read operation of the actual block or a single-threaded write to the actual block. The processing logic may then modify a selected portion of the content in the corresponding virtual subblocks to form a modified selected portion. The processing logic may then update the mapping in the pointer map by mapping a memory location of the modified selected portion in the virtual subblocks with the memory location of the content in the actual subblocks, respectively. The processing logic may also append a change notification to the modified selected portion such that the change notification reflects a changed status of the modified selected portion.

In some embodiments, the processing logic may provide a client with access to the virtual subblocks and enable multithreaded operations on the virtual subblocks by different threads of execution. Each thread may have access to a corresponding actual subblock. The processing logic may then update the contents of the virtual subblocks to reflect changes made to the actual subblocks by other threads and aggregate the modified actual subblocks to create a modified actual block.

Figure 3:
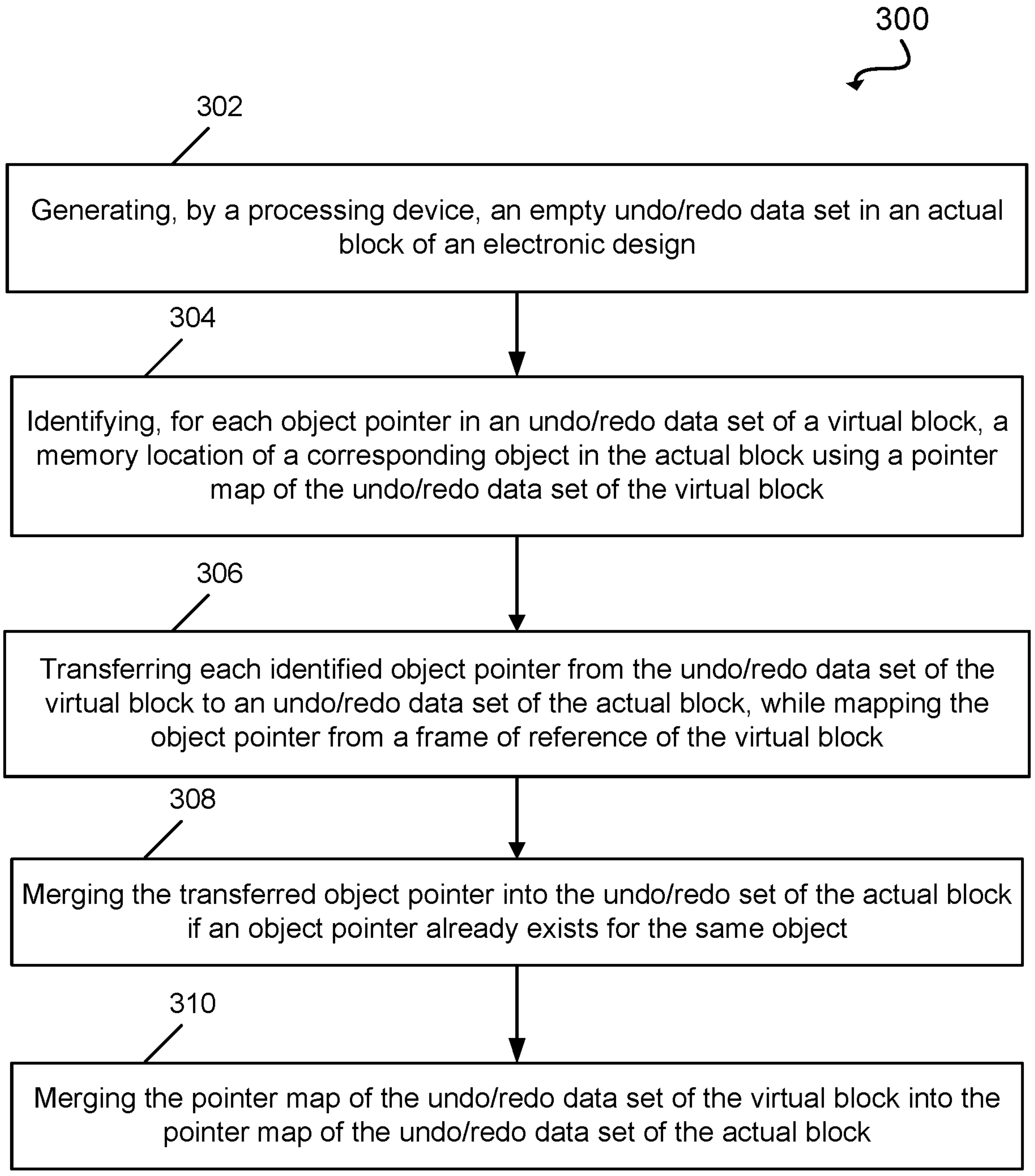
FIG. 3 illustrates example operations in a computer-implemented method for block virtualization for multi-threaded EDA read/write database access, in accordance with an embodiment of the present disclosure.

FIG. 3 depicts a flow diagram of example method 300 for block virtualization for multi-threaded EDA read/write database access, according to some implementations. Method 300 may be performed by one or more processing devices (e.g., processing device 502 illustrated in FIG. 5) that may comprise hardware (e.g., circuitry, dedicated logic), software (such as is run on a general-purpose computer system or a dedicated machine), or a combination of both. Method 300 and each of its individual functions, routines, subroutines, or operations may be performed by one or more processors of the processing device executing the method. In certain implementations, method 300 may be performed by a single processing device. Alternatively, method 300 may be performed by two or more processing devices, each processing device executing one or more individual functions, routines, subroutines, or operations of the method.

This embodiment relates to a computer-implemented method for managing undo/redo data in a virtual block-based system. At operation 302, the processing logic of the processing device may generate an empty undo/redo data in an actual block of the electronic design. The undo/redo data may include information about the changes made to the data, as well as any other relevant information needed to perform the undo or redo operation. For example, when a transaction is executed on the database, the processing logic keeps track of the changes that were made to the data. This may include both the original data before the transaction was executed and the new data that resulted from the transaction. In some embodiments, the undo/redo data may be stored in memory or on disk and may be used by the processing logic to support operation rollback and recovery.

At operation 304, the processing logic may identify, for each memtoSet map element in the undo/redo data set of a virtual block, a corresponding main object's memory location using the virtual block's undo/redo data set pointer map. In a virtual block-based system, changes made to objects in a virtual block are stored in the block's undo/redo data set. When a user decides to undo or redo a change, the virtual block needs to transfer the changes back to the main undo/redo data set. The first step of the method involves identifying the memory location of each object in the virtual block's undo/redo data set. At operation 306, the processing logic may transfer each identified memtoSet map element from the virtual block's undo/redo data set to main's undo/redo data set, while mapping the object pointer from the virtual block's frame of reference back to the corresponding main object's memory location using the virtual block's undo/redo data set pointer map. Once the memory location of each object has been identified, the next step is to transfer the changes from the virtual block's undo/redo data set to the main undo/redo data set. This involves mapping the object pointer from the virtual block's frame of reference back to the corresponding main object's memory location using the virtual block's undo/redo data set pointer map. At operation 308, the processing logic may merge the transferred memtoSet into an existing memtoSet in main object's undo/redo set, if one already exists for the same object. In some cases, the object being transferred from the virtual block's undo/redo data set may already have a memtoSet in the main undo/redo set. If this is the case, the transferred memtoSet needs to be merged with the existing memtoSet to ensure that all changes are properly accounted for. At operation 310, the processing logic may merge the virtual block's undo/redo data set pointer map into main's undo/redo data set pointer map. In addition to transferring the changes from the virtual block's undo/redo data set to the main undo/redo set, the method also involves merging the virtual block's undo/redo data set pointer map into the main undo/redo data set pointer map. This is necessary to ensure that any object pointers contained in the member data of objects being restored can be converted to the main context. Finally, the processing logic may destroy the virtual block and its undo/redo data once all changes have been transferred to the main undo/redo data set.

Another embodiment is a computer-implemented method for managing changes in the object-based system described above. The method includes gathering and sending all preDelete and preModify notifications required to be sent for a redo change. When an object-based system performs a redo operation, it needs to notify any interested parties that changes are about to be made to certain objects in the system. These notifications, known as preDelete and preModify notifications, are sent to listeners registered with the system. The first step of the method involves gathering all of the preDelete and preModify notifications required for the redo change and sending them to the appropriate listeners.

A pre-delete notification may be used to provide advance notification to a user that an object or data is about to be deleted. This notification is typically triggered when a user initiates a delete operation on an object or data. The purpose of this notification is to give the user an opportunity to review and possibly modify the data before it is deleted. This can be useful in situations where the data is critical or irreplaceable, or where the user may have made a mistake and wants to undo the delete operation. This allows the user to easily undo the delete operation if they change their mind or redo it if they decide that the data should be deleted after all. The pre-delete notification is an important feature in an undo/redo dataset that helps to prevent accidental data loss and gives users greater control over their data.

Similarly, a preModify notification is a type of notification that is sent to signal that a data object is about to be modified. It is typically used to provide information about the impending modification to any interested observers, such as user interface elements or other parts of the software system. The processing logic may maintain a history of changes made to data objects. Each change is recorded as an action in the history, which can be undone or redone as needed. In order to accurately maintain this history, the processing logic must be able to detect when a data object is about to be modified and record the change before it happens. The preModify notification is one way of accomplishing this. When an object is about to be modified, the processing logic can send out a preModify notification to any interested parties, letting them know that a change is about to occur. This gives observers an opportunity to record any relevant information before the change is made. Once the preModify notification has been sent, the processing logic can proceed with making the desired modifications to the data object. After the modification has been made, the processing logic can then record the change in the undo/redo history as a separate action. This allows the user to undo or redo the change as needed and provides a complete record of all modifications made to the data object over time.

For each memtoSet map element, the processing logic may then apply the memtoSet's post memto to the object to set it to its final, modified state. The post memto represents the final, modified state of the object after the redo operation has been completed. Once the preDelete and preModify notifications have been sent, the system applies the changes that were made during the redo operation. Finally, the method involves gathering and sending all postCreate and postModify notifications required for the redo change. These notifications inform listeners that the changes have been made and provide them with information about the new state of the block of electronic design. A "listener" may refer to a process or thread that is responsible for accepting incoming database connection requests from clients. The listener typically runs independently of the workers responsible for processing database requests. When a client requests a database connection, the listener receives the request and creates a new worker to handle the client's request. The listener is responsible for managing the connection pool, which is a collection of pre-established database connections that can be reused by multiple clients. The listener can create and manage new connections as needed, and it can also close idle connections to free up system resources.

A postCreate notification is a type of notification that is sent to signal that a new data object has been created. It is typically used to provide information about the creation of the object to any interested observers, such as user interface elements or other parts of the software system. The processing logic maintains a history of changes made to data objects. Each change is recorded as an action in the history, which can be undone or redone as needed. In order to accurately maintain this history, the processing logic must be able to detect when a new data object is created and record the creation in the history. The postCreate notification is one way of accomplishing this. When a new object is created, the processing logic can send out a postCreate notification to any interested parties, letting them know that a new object has been created. This gives observers an opportunity to record any relevant information about the object's creation.

Once the postCreate notification has been sent, the processing logic can proceed with using the new data object as needed. If the creation of the object is an undoable action, the processing logic can also record the creation in the undo/redo history as a separate action. This allows the user to undo or redo the creation of the object as needed and provides a complete record of all modifications made to the data objects over time.

Figure 4:
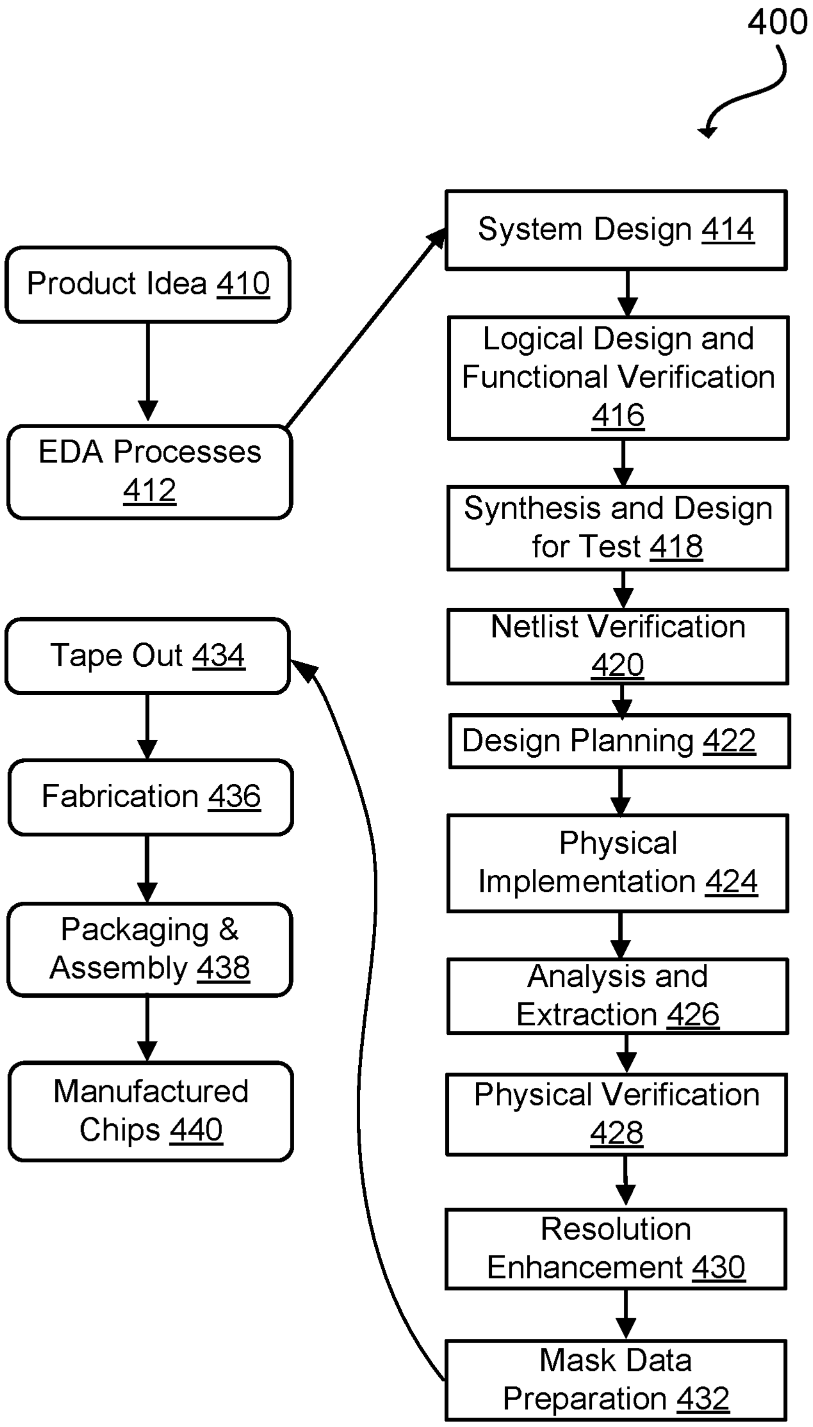
FIG. 4 depicts a flowchart of various processes used during the design and manufacture of an integrated circuit in accordance with some embodiments of the present disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. These processes can start with the creation of a product idea 410 with information supplied by a designer, information which is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die can be fabricated 436 and packaging and assembly processes 438 can be performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which can be used for detailed descriptions of circuits with many analog components. Descriptions at each level of abstraction are enabled for use by the corresponding tools of that layer (e.g., a formal verification tool). A design process may use a sequence depicted in FIG. 4. The processes described herein can be enabled by EDA products (or tools).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit can be specified in one or more description languages and the specification can be checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' can be used to speed up the functional verification.

During synthesis and design for test 418, HDL code can be transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist can be checked for compliance with timing constraints and for correspondence with the HDL code. During design planning 422, an overall floor plan for the integrated circuit can be constructed and analyzed for timing and top-level routing.

During layout or physical implementation 424, physical placement (positioning of circuit components such as transistors or capacitors) and routing (connection of the circuit components by multiple conductors) can occur, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and can be enabled as both physical structures and in simulations. Parameters can be specified for selected cells (based on 'standard cells') such as size and made accessible in a database for use by EDA products.

During analysis and extraction 426, the circuit function can be verified at the layout level, which permits refinement of the layout design. During physical verification 428, the layout design can be checked to ensure that manufacturing constraints are correct, such as DRC constraints, electrical constraints, lithographic constraints, and that circuitry function matches the HDL design specification. During resolution enhancement 430, the geometry of the layout can be transformed to improve how the circuit design is manufactured.

During tape-out, data can be created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 of FIG. 5) may be used to store the programs and data structures that are used by some or all of the EDA products described herein, and products used for development of cells for the library and for physical and logical design that use the library.

Figure 5:
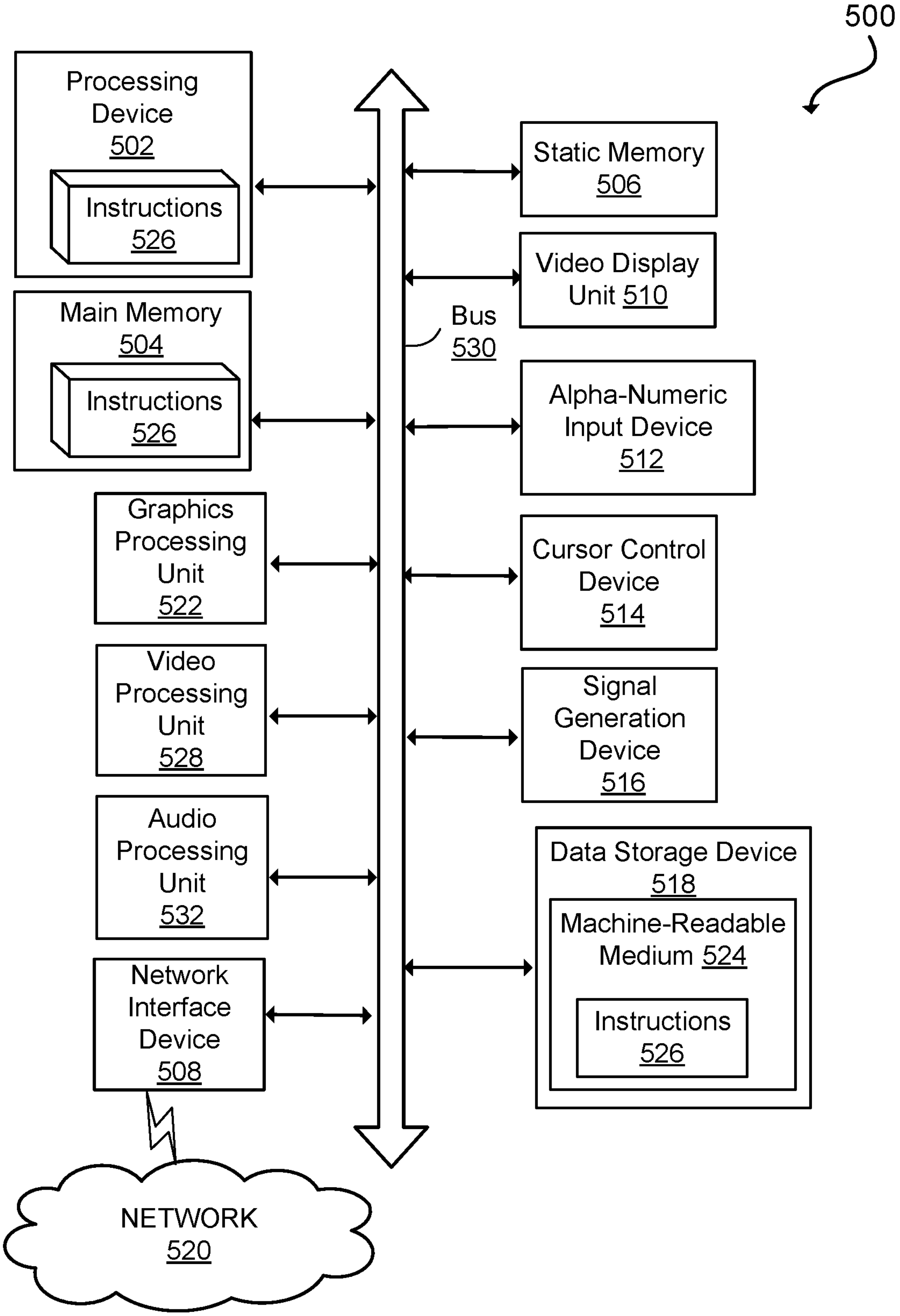
FIG. 5 depicts a diagram of an example computer system in which embodiments of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In one embodiment, the non-transitory computer readable medium may include instructions 526 which when executed by a processing device (e.g., processing device 502), cause the processing device to generate a virtual block corresponding to an actual block of an electronic design. The virtual block may include a plurality of virtual subblocks corresponding to a plurality of actual subblocks in the actual block. The processing device may then clone contents of the actual subblocks in the corresponding virtual subblocks and link the cloned contents in the virtual subblocks to the corresponding actual subblocks. However, no data is copied. The processing device may then copy contents of one or more of the actual subblocks in the actual block to the corresponding virtual subblocks in the virtual block, respectively. The contents are copied in such a way that a memory location of the content copied to the virtual subblocks of virtual block differs from a memory location of the content in the actual subblocks of the actual block. The processing device may then map the memory location of the content copied to the virtual subblocks and the memory location of the content in the actual subblocks in a pointer map. The processing device may then select at least a portion of the content copied to the virtual subblocks to be modified in the actual subblocks. The processing device then makes the selected portion of the content in virtual subblocks to be writeable. Since the processing device is configured to operate under the MROW policy, the processing device may either perform a multi-threaded read operation of the actual block or a single-threaded write to the actual block. The processing device may then modify a selected portion of the content in the corresponding virtual subblocks to form a modified selected portion. The processing device may then update the mapping in the pointer map by mapping a memory location of the modified selected portion in the virtual subblocks with the memory location of the content in the actual subblocks, respectively.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It may be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It may be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:

accessing, by a processing device, an electronic design of an integrated circuit, the electronic design comprising modeled circuitry components;

generating a virtual block corresponding to an actual block of the electronic design, the virtual block comprising a plurality of virtual subblocks corresponding to a plurality of actual subblocks in the actual block, wherein the processing device is configured to operate under a data policy, and under the data policy, the processing device is to perform at least one of a multi-threaded read operation of the actual block or a single-threaded write to the actual block;

cloning contents of the plurality of actual subblocks in the corresponding virtual subblocks, wherein the cloned contents in the virtual subblocks are linked to the corresponding actual subblocks;

copying contents of one or more of the actual subblocks to the corresponding virtual subblocks, wherein a memory location of the content copied to the virtual subblocks differs from a memory location of the content in the actual subblocks; and mapping the memory location of the content copied to the virtual subblocks and the memory location of the content in the actual subblocks in a pointer map.

2. The method of claim 1, further comprising:

selecting at least a portion of the content copied to the virtual subblocks to be modified in the actual subblocks;

making the selected portion of the content to be writeable in the corresponding virtual subblocks;

modifying the selected portion of the content in the corresponding virtual subblocks to form a modified selected portion; and mapping a memory location of the modified selected portion in the virtual subblocks with the memory location of the content in the actual subblocks in the pointer map.

3. The method of claim 2, further comprising:

appending a change notification to the modified selected portion, wherein the change notification reflects a changed status of the modified selected portion.

4. The method of claim 2, further comprising:

receiving a notification that at least a portion of the content in the virtual subblocks has been modified; and mapping a memory location of the modified portion in the virtual subblocks and the memory location of the corresponding content in the actual subblocks in the pointer map.

5. The method of claim 4, further comprising:

responsive to determining that the memory location of the modified selected portion in the virtual subblocks and the memory location of the original content in the actual subblocks are already stored in the pointer map, merging the memory location of the modified portion in the virtual subblocks and the memory location of the modified selected portion in the virtual subblocks.

6. The method of claim 1, further comprising:

receiving a query for a memory location of one or more elements in the virtual subblocks; and returning, in response to the query, the memory location of the one or more elements in the actual subblocks corresponding to the virtual subblocks.

7. The method of claim 1, further comprising:

providing a client with access to the virtual subblocks;

enabling multithreaded operations on the virtual subblocks by different threads of execution, wherein each thread has access to a corresponding actual subblock;

updating the contents of the virtual subblocks to reflect changes made to the actual subblocks by other threads; and aggregating the modified actual subblocks to create a modified actual block.

8. A non-transitory computer-readable medium storing instructions that, when executed, cause a processing device to:

generate a virtual block corresponding to an actual block of an electronic design of an integrated circuit, the electronic design comprising modeled circuitry components, wherein the virtual block comprises a plurality of virtual subblocks corresponding to a plurality of actual subblocks in the actual block, wherein the processing device is configured to operate under a data policy, and under the data policy, the processing device is to perform at least one of a multi-threaded read operation of the actual block or a single-threaded write to the actual block;

clone contents of the plurality of actual subblocks in the corresponding virtual subblocks, wherein the cloned contents in the virtual subblocks are linked to the corresponding actual subblocks and no data is copied;

copy contents of one or more of the actual subblocks to the corresponding virtual subblocks, wherein a memory location of the content copied to the virtual subblocks differs from a memory location of the content in the actual subblocks; and map the memory location of the content copied to the virtual subblocks and the memory location of the content in the actual subblocks in a pointer map.

9. The non-transitory computer-readable medium of claim 8, wherein the instructions further cause the processing device to:

select at least a portion of the content copied to the virtual subblocks to be modified in the actual subblocks;

make the selected portion of the content to be writeable in the corresponding virtual subblocks;

modify the selected portion of the content in the corresponding virtual subblocks to form a modified selected portion; and map a memory location of the modified selected portion in the virtual subblocks with the memory location of the content in the actual subblocks in the pointer map.

10. The non-transitory computer-readable medium of claim 9, wherein the instructions further cause the processing device to:

append a change notification to the modified selected portion, wherein the change notification reflects a changed status of the modified selected portion.

11. The non-transitory computer-readable medium of claim 9, wherein the instructions further cause the processing device to:

receive a notification that at least a portion of the content in the virtual subblocks has been modified; and map the memory location of the modified portion in the virtual subblocks and the memory location of the original content in the actual subblocks in the pointer map.

12. The non-transitory computer-readable medium of claim 11, wherein the instructions further cause the processing device to:

responsive to determining that the memory location of the modified selected portion in the virtual subblocks and the memory location of the content in the actual subblocks are already stored in the pointer map, merge the memory location of the modified portion in the virtual subblocks and the memory location of the modified selected portion in the virtual subblocks.

13. The non-transitory computer-readable medium of claim 8, wherein the instructions further cause the processing device to:

receive a query for a memory location of one or more elements in the virtual subblocks; and return, in response to the query, the memory location of the one or more elements in the actual subblocks corresponding to the virtual subblocks.

14. The non-transitory computer-readable medium of claim 8, wherein the instructions further cause the processing device to:

provide a client with access to the virtual subblocks;

enable multithreaded operations on the virtual subblocks by different threads of execution, wherein each thread has access to a corresponding actual subblock;

update the contents of the virtual subblocks to reflect changes made to the actual subblocks by other threads; and aggregate the modified actual subblocks to create a modified actual block.

15. A system, comprising:

a memory; and a processing device operatively coupled to the memory, the processing device configured to:

generate a virtual block corresponding to an actual block of an electronic design of an integrated circuit, the electronic design comprising modeled circuitry components, wherein the virtual block comprises a plurality of virtual subblocks corresponding to a plurality of actual subblocks in the actual block, wherein the processing device is configured to operate under a data policy, and under the data policy, the processing device is to perform at least one of a multi-threaded read operation of the actual block or a single-threaded write to the actual block;

clone contents of the plurality of actual subblocks in the corresponding virtual subblocks, wherein the cloned contents in the virtual subblocks are linked to the corresponding actual subblocks and no data is copied;

copy contents of one or more of the actual subblocks to the corresponding virtual subblocks, wherein a memory location of the content copied to the virtual subblocks differs from a memory location of the content in the actual subblocks; and map the memory location of the content copied to the virtual subblocks and the memory location of the content in the actual subblocks in a pointer map.

16. The system of claim 15, wherein the processing device is further configured to:

select at least a portion of the content copied to the virtual subblocks to be modified in the actual subblocks;

make the selected portion of the content to be writeable in the corresponding virtual subblocks;

modify the selected portion of the content in the corresponding virtual subblocks to form a modified selected portion; and map a memory location of the modified selected portion in the virtual subblocks with the memory location of the content in the actual subblocks in the pointer map.

17. The system of claim 16, wherein the processing device is further configured to:

append a change notification to the modified selected portion, wherein the change notification reflects a changed status of the modified selected portion.

18. The system of claim 16, wherein the processing device is further configured to:

receive a notification that at least a portion of the content in the virtual subblocks has been modified; and map the memory location of the modified portion in the virtual subblocks and the memory location of the original content in the actual subblocks in the pointer map.

* * * * *